US008264872B2

(12) United States Patent
De Sandre et al.

(10) Patent No.: US 8,264,872 B2
(45) Date of Patent: Sep. 11, 2012

(54) COLUMN DECODER FOR NON-VOLATILE MEMORY DEVICES, IN PARTICULAR OF THE PHASE-CHANGE TYPE

(75) Inventors: Guido De Sandre, Brugherio (IT); Marco Pasotti, S. Martino Siccomario (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 400 days.

(21) Appl. No.: 12/548,241

(22) Filed: Aug. 26, 2009

(65) Prior Publication Data

US 2010/0054031 A1    Mar. 4, 2010

(30) Foreign Application Priority Data

Aug. 29, 2008 (IT) .............................. TO2008A0647

(51) Int. Cl.
*G11C 11/00* (2006.01)
*G11C 8/10* (2006.01)
*G11C 7/00* (2006.01)

(52) U.S. Cl. ............ 365/163; 365/230.06; 365/189.011; 365/148

(58) Field of Classification Search .................. 365/163, 365/230.06, 189.011, 148
See application file for complete search history.

(56) References Cited

U.S. PATENT DOCUMENTS

| | | | |
|---|---|---|---|
| 4,954,991 A | 9/1990 | Saeki et al. | |
| 6,687,153 B2* | 2/2004 | Lowrey | 365/163 |
| 6,914,814 B2 | 7/2005 | Im et al. | |
| 7,075,841 B2* | 7/2006 | Resta et al. | 365/189.16 |
| 7,324,371 B2* | 1/2008 | Khouri et al. | 365/163 |
| 7,495,944 B2* | 2/2009 | Parkinson et al. | 365/148 |
| 7,782,695 B2* | 8/2010 | Bedarida et al. | 365/205 |
| 2001/0015933 A1 | 8/2001 | Reddy et al. | |
| 2003/0133325 A1 | 7/2003 | Silvagni et al. | |
| 2008/0089154 A1 | 4/2008 | Terao et al. | |

OTHER PUBLICATIONS

Kang et al., "A 0.1-μm 1.8-V 256-Mb Phase-Change Random Access Memory (PRAM) With 66-MHz Synchronous Burst-Read Operation," IEEE Journal of Solid-State Circuits 42(1):210-218, Jan. 2007.
Pathak et al., "A 1.8V 64 Mb 100MHz Flexible Read While Write Flash Memory [inCMOS]," Digest of Technical Papers. IEEE International Solid-State Circuits Conference, San Francisco, CA, Feb. 5-7, 2001, pp. 32-33, 424-425.

* cited by examiner

*Primary Examiner* — VanThu Nguyen
*Assistant Examiner* — Hai Pham
(74) *Attorney, Agent, or Firm* — Seed IP Law Group PLLC

(57) ABSTRACT

A column decoder is for a phase-change memory device provided with an array of memory cells, a reading stage for reading data contained in the memory cells, and a programming stage for programming the data. The column decoder selects and enables biasing of a bitline of the array and generates a current path between the bitline and the reading stage or, alternatively, the programming stage, respectively during a reading or a programming operation of the contents of the memory cells. In the column decoder, a first decoder circuit generates a first current path between the bitline and the reading stage, and a second decoder circuit, distinct and separate from the first decoder circuit, generates a second current path, distinct from the first current path, between the bitline and the programming stage.

12 Claims, 4 Drawing Sheets

COLUMN DECODER FOR NON-VOLATILE MEMORY DEVICES, IN PARTICULAR OF THE PHASE-CHANGE TYPE

BACKGROUND

1. Technical Field

The present disclosure relates to a column decoder for non-volatile memory devices, in particular of the phase-change type, to which the following treatment will make particular reference, without this implying any loss of generality.

2. Description of the Related Art

Non-volatile phase-change memories (PCMs) are known, wherein the characteristics of materials that have the property of switching between phases having different electrical characteristics are exploited for storing information. For example, these materials can switch between a disorderly amorphous phase and an orderly crystalline or polycrystalline phase, and the two phases are associated with resistivities of considerably different values, and consequently with a different value of a stored datum. For example, the elements of Group VI of the periodic table, such as tellurium (Te), selenium (Se), or antimonium (Sb), referred to as chalcogenides or chalcogenic materials, can be advantageously used for manufacturing phase-change memory cells. The phase changes are obtained by increasing locally the temperature of the cells of chalcogenic material, through resistive electrodes (generally known as heaters) set in contact with respective regions of chalcogenic material. Selection devices (for example, MOSFETs), are connected to the heaters, and enable passage of a programming electrical current through a respective heater; this electrical current, by the Joule effect, generates the temperatures necessary for the phase change. During reading, the state of the chalcogenic material is detected by applying a voltage that is sufficiently low as not to cause a marked heating, and then by reading the value of the current that flows in the cell. Since the current is proportional to the conductivity of the chalcogenic material, it is possible to determine in which state the material is, and hence determine the data stored in the memory cells.

In a known manner, non-volatile memories include an array of memory cells organized in rows (wordlines) and columns (bitlines). Each memory cell is formed, in the case of PCMs, by a phase-change memory element and by a selector transistor, connected in series. A column decoder and a row decoder, on the basis of logic address signals received at input and more or less complex decoding schemes, enable selection of the memory cells, and in particular of the corresponding wordlines and bitlines each time addressed.

The column decoder comprises a plurality of analog selection switches (made by transistors), which receive on their respective control terminals the address signals. The selection switches are organized according to a tree structure in hierarchical levels, and their number in each hierarchical level is linked to the organization and to the size of the memory array. The selection switches, when enabled, allow the selected bitline to be brought to a definite value of voltage and/or current, according to the operations that it is desired to implement. In particular, a current path is created between a programming stage or a reading stage and the bitline selected. The current path is defined by the series of a certain number of selection switches, and is the same (within the memory array) both for the programming stage and for the reading stage. In particular, upstream of the current path, a selector is generally provided for associating the path alternatively with the programming stage or with the reading stage. Generally, the bitline-biasing voltages for reading operations are generated inside sense amplifiers used for reading the data in the reading stage, whilst the bitline-biasing voltages for writing operations are generated inside purposely provided programming drivers in the programming stage. In a known manner, the sense amplifiers carry out reading of the data stored in the memory cells, comparing the current that flows in the memory cell selected (or an electrical quantity correlated thereto) with a reference current that flows in a reference cell having known contents.

In the specific case of PCMs, in order to carry out reading, voltages of a very low value (for example, between 300 mV and 600 mV) and currents of a standard value (for example, in the region of 10-20 $\mu$A) are used, whilst for carrying out writing, voltages of a markedly higher value (for example, approximately 2 V higher than the voltage used for the reading operations) and high currents (for example, in the region of 600 $\mu$A) are used; also used, during reading, is a fast settling in the column coding.

In a known manner, in flash memories of a NOR type, the selection switches are usually implemented with high-voltage (HV) NMOS transistors, capable of withstanding both the reading voltages and the programming voltages (see, for example: "A 1.8V 64 Mb 100 MHz Flexible Read While Write Flash Memory", ISSCC 2001, Session 2—Non-Volatile Memories). This choice enables a greater circuit simplicity (no substrate to be biased) and a saving in the area occupation. In PCMs the use of CMOS switches has also been proposed (see, for example: "A 0.1 $\mu$m 1.8V 256 Mb Phase-Change Random Access Memory (PRAM) With 66 MHz Synchronous Burst-Read Operation", Sangbeon Kang et al., IEEE JSSC, Vol. 42, No. 1, January 2007).

Both of the solutions have disadvantages: a decoding implemented completely with NMOS switches uses high voltages for driving the switches during the programming phase, on account of the body effect on the switches, whilst the approach with CMOS switches entails a greater area occupation.

In addition, in the column decoder described previously the effective voltage on the bitlines is affected by a series of factors that are not foreseeable: process variations in the manufacturing of the selection switches connected in series along the read/write path, and the consequent variation in the voltage drops on these selection switches; temperature variations; the current used by the memory cell; and variations of the read/write biasing voltage. Consequently, fluctuations can arise on the bitline voltage, and may possibly cause errors in the read/write operations.

BRIEF SUMMARY

One embodiment is a column decoder, in particular for a PCM device, that enables a solution to all or part of the problems associated with decoders of a known type, and that is optimized as regards the electrical characteristics, with particular regard to the specifications of PCMs (see the previous discussion).

One embodiment is a column decoder for a phase-change memory device provided with an array of memory cells, a reading stage for reading data contained in the memory cells, and a programming stage for programming the data. The column decoder includes a read terminal configured to be coupled to the reading stage; a programming terminal configured to be coupled to the programming stage; and a bitline terminal configured to be coupled to a bitline of the array. The column decoder also includes a first decoder circuit configured to provide a first current path between the bitline terminal and the reading terminal, and a second decoder circuit, distinct and separate from the first decoder circuit, configured to provide a second current path, distinct from the first current path, between the bitline terminal and the programming terminal.

BRIEF DESCRIPTION OF THE SEVERAL VIEWS OF THE DRAWINGS

For a better understanding of the present disclosure, preferred embodiments thereof are now described, purely by way of non-limiting example and with reference to the attached drawings, wherein.

DETAILED DESCRIPTION

As will be described in detail in what follows, an aspect of the present disclosure envisages the generation of two distinct current paths within the column decoder: a first path, designed for operations of reading of the memory cells, and defined for this reason in what follows as "reading path"; and a second path, totally distinct and separate from the reading path, designed for the programming operations, and defined for this reason in what follows as "programming path".

Figure 1:
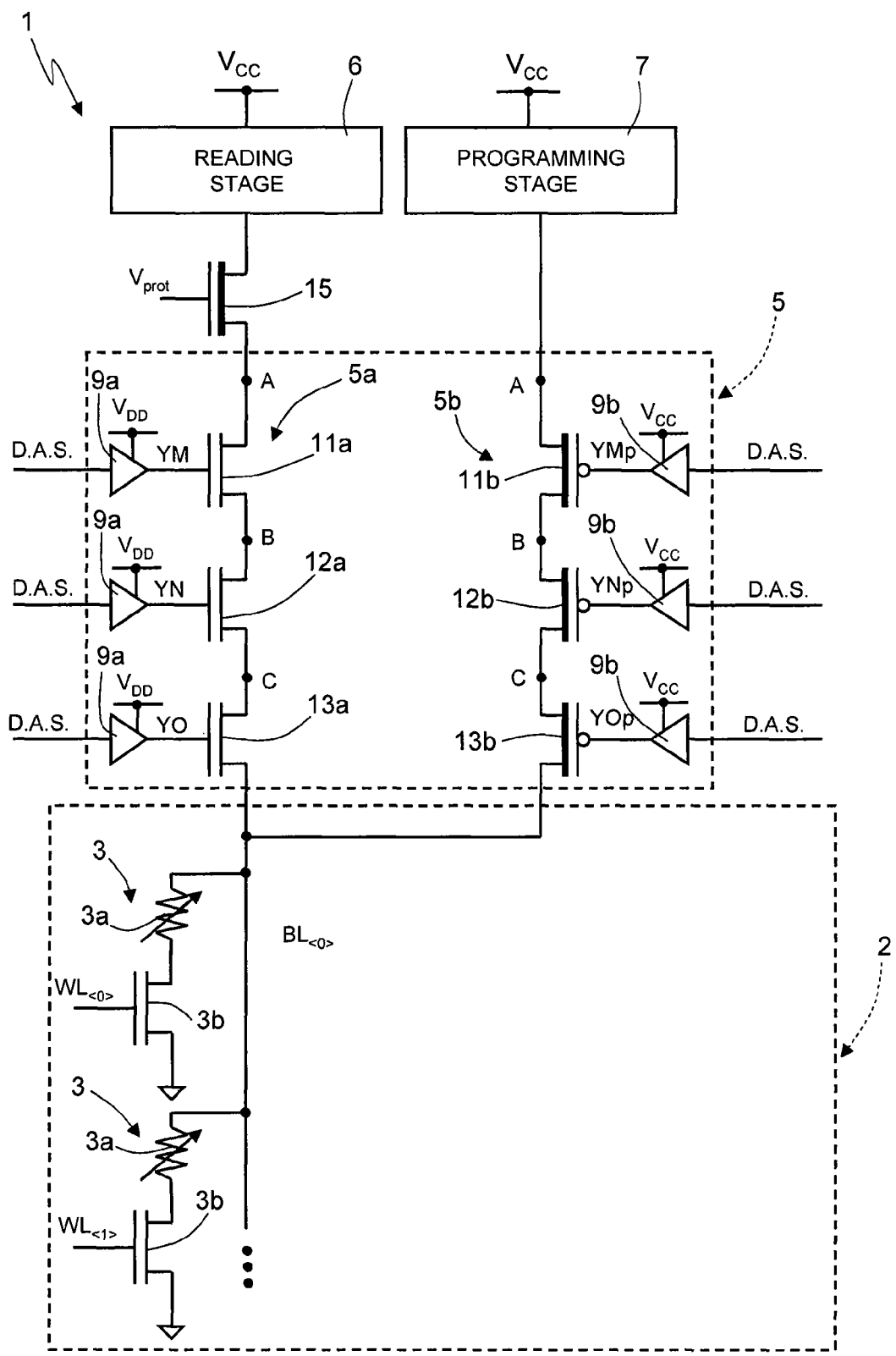
FIG. 1 shows a schematic circuit diagram of a portion of a non-volatile memory device, in particular of a PCM type, and of a corresponding column decoder, according to a first embodiment.

In FIG. 1 a non-volatile memory device, in particular of a PCM type, designated as a whole by the reference number 1, is shown schematically, limitedly to just the parts useful for an understanding of the present disclosure.

In particular, the non-volatile memory device 1 comprises a memory array 2, constituted by a plurality of memory cells 3, arranged according to wordlines WL and bitlines BL (shown by way of example in FIG. 1 are two memory cells 3, two wordlines WL, designated by WL<0> and WL<1>, and a single bitline BL, designated by BL<0>). The memory cells 3 are identical to one another and comprise a phase-change element 3a and a selector element 3b, operatively coupled thereto. The phase-change element 3a includes a phase-change material (for example, a chalcogenide), and is hence able to store data in the form of resistance levels associated with the different phases assumed by the phase-change material (in FIG. 1, the phase-change element 3a is shown as a resistor with variable resistance). The selector element 3b, in the embodiment illustrated, is an NMOS transistor having its gate terminal connected to the wordline WL, its drain terminal connected to the phase-change element 3a, and its source terminal connected to a reference potential (for example, to ground). As has been described previously, the selector element 3b is controlled so as to enable, when selected, the passage of a reading/programming current through the phase-change element 3a during respective reading/programming operations.

The non-volatile memory device 1 further comprises a row decoder (here not illustrated), designed to select the wordline corresponding to the memory cell each time to be addressed, and a column decoder 5, designed to select the bitline of the memory cell to be addressed. The column decoder 5 is set between the memory array 2, and a reading stage 6, of a known type and provided with a sense amplifier and a biasing circuit (not illustrated) and a programming stage 7, which is also of a type in itself known and is provided with programming drivers (not illustrated). In particular, the column decoder 5 receives at input address-selection signals DAS (decoded address signals), which are generated in a per-se known manner (that is not illustrated in detail), and have a low voltage (i.e., operating in the logic voltage range [GND, VDD], where VDD is the logic voltage, for example, comprised between 1 V and 1.4 V). The column decoder 5 is configured to generate a current path between the selected bitline BL and the reading stage 6 or, alternatively, the programming stage 7. The reading stage 6 and the programming stage 7 operate in the high-voltage range [GND, VCC] (where VCC is the high voltage, for example, comprised between 2.5 V and 3.5 V) and generate respective biasing signals for the addressed bitline.

According to a particular embodiment, the column decoder 5 comprises two distinct decoder circuits, and in particular a reading decoder 5a and a programming decoder 5b, which are designed to generate a current path towards the reading stage 6 and, respectively, towards the programming stage 7 (the current paths thus generated being completely distinct and separate).

The reading decoder 5a and the programming decoder 5b have a specular circuit structure and are schematically represented by means of a plurality of selection switches, made using MOS transistors, which are connected to one another in series and receive on their control terminals respective column-decoding signals. The number of selection switches forming the column decoder 5 depends, in a known manner, upon the size of the memory array 2 or of the sectors of the memory array 2 and upon the hierarchical organization of the column selectors. Illustrated by way of example in FIG. 1 are a reading decoder 5a and a programming decoder 5b both formed by three selection switches, designated respectively by 11a, 12a, 13a (for the reading decoder 5a) and 11b, 12b, 13b (for the programming decoder 5b), which receive on their terminals respective column-decoding signals YM, YN, Y0 (for the reading decoder 5a) and YMp, YNp, Y0p (for the programming decoder 5b). The reading decoder 5a and the programming decoder 5b further comprise a respective plurality of buffers 9a, 9b equal in number to the selection switches, which supply to the control terminals of the selection switches the column-decoding signals YM, YN, Y0 and YMp, YNp, Y0p according to the address-selection signals DAS received at their input. In particular, the selection switches 11a, 12a, 13a of the reading decoder 5a are formed by low-voltage NMOS transistors, which have a control terminal that receives a respective column-decoding signal YM, YN, Y0, i.e., a logic signal having a voltage range [GND, VDD]. Instead, the selection switches 11b, 12b, 13b of the programming decoder 5b are formed by high-voltage PMOS transistors, having a control terminal which receives a respective column-decoding signal YMp, YNp, Y0p, i.e., a logic signal having a high voltage range [GND, VCC].

Moreover, intermediate nodes A, B and C are defined between the bitline, and the reading stage 6 or the programming stage 7 (respectively in the reading decoder 5a and in the programming decoder 5b): in particular, the intermediate node A is connected to the drain terminal of the selection switch 11a, 11b receiving the column-decoding signal YM, YMp; the intermediate node B is connected to the drain terminal of the selection switch 12a, 12b receiving the column-decoding signal YN, YNp; and the intermediate node C is connected to the drain terminal of the selection switch 13a, 13b receiving the column-decoding signal YO, YOp.

In use, according to the value of the address-selection signals DAS, alternatively a current path towards the reading stage 6 or towards the programming stage 7 is generated in the column decoder 5 for the bitline BL selected, according to the nature of the operation to be carried out on the addressed memory cell. In particular, first address signals DAS are supplied to the control terminals of the NMOS selection switches, and second address signals DAS are supplied to the control terminals of the PMOS selection switches, the address signals having respective voltage and timing values specific for the reading or programming operation to be carried out. When an operation is not in progress, the respective address signals are disabled, interrupting the respective current path. In particular, the reading decoder 5a and the programming decoder 5b generate, respectively in reading and programming, two distinct current paths between the bitline BL and the reading/programming stages, the former constituted by the series of all low-voltage NMOS transistors, active only during the reading operations, and the latter by the series of all high-voltage PMOS transistors, active only during the programming operations.

In the case where, as is shown in FIG. 1, the reading stage 6 operates in the high-voltage range, the non-volatile memory device 1 further comprises a protection transistor 15, in particular a high-voltage NMOS transistor, inserted in the reading current path, set between the reading stage 6 and the reading decoder 5a. The protection transistor 15 is configured so as to protect the low-voltage side of the reading path, by setting on its source terminal a voltage of a value compatible with the circuitry downstream. In particular, its gate terminal is biased at an appropriate protection voltage $V_{prot}$, or else, when the voltage values for the reading operation have also to be defined, to a voltage such as to supply a desired reading voltage $V_{read}$ on the selected bitline BL (as specified before, for example, of a value between 0.3V and 0.6V).

The selection switch 13a of the reading decoder 5a, connected directly to the bitline BL and receiving the column-decoding signal YO, is configured to withstand the programming voltages present on the bitline BL during the programming operations. Even though said voltage values can be higher than the specification limits envisaged for normal operation of the corresponding NMOS transistor, it is, however, possible to guarantee the reliability of the non-volatile memory device 1 for a given voltage overshoot and for a given number of programming cycles. In fact, it may be noted that also the selector elements 3b are formed by low-voltage NMOS transistors, which, in use, are subjected to the same voltage overshoot during the programming operations. The general reliability of the non-volatile memory device 1 is not consequently degraded by the presence of the NMOS transistors in the reading decoder 5a.

Advantageously, the separation of the current paths for the reading and programming operations enables the NMOS transistors and the PMOS transistors of the reading and programming decoders 5a, 5b to be designed in an optimal way, based on the specific and different requirements in reading and writing, respectively. Sizing of the transistors can be made in an altogether independent way in the reading and programming paths, guaranteeing a general optimization of the electrical performance.

The contributions of the parasitic capacitances due to the transistors used along one path do not affect the other path, hence decreasing in absolute value the effects of the same parasitic capacitances on the reading and programming operations, and any slowing-down associated thereto.

In addition, the increase of area occupied due to the greater number of selection switches is limited, in so far as the additional low-voltage NMOS transistors notoriously occupy much less area as compared to high-voltage transistors.

The NMOS transistors of the reading path are also driven by column-decoding signals with value in the logic voltage range, and consequently no "level-shifting" operations are required, to the advantage of access time in reading.

Figure 2:
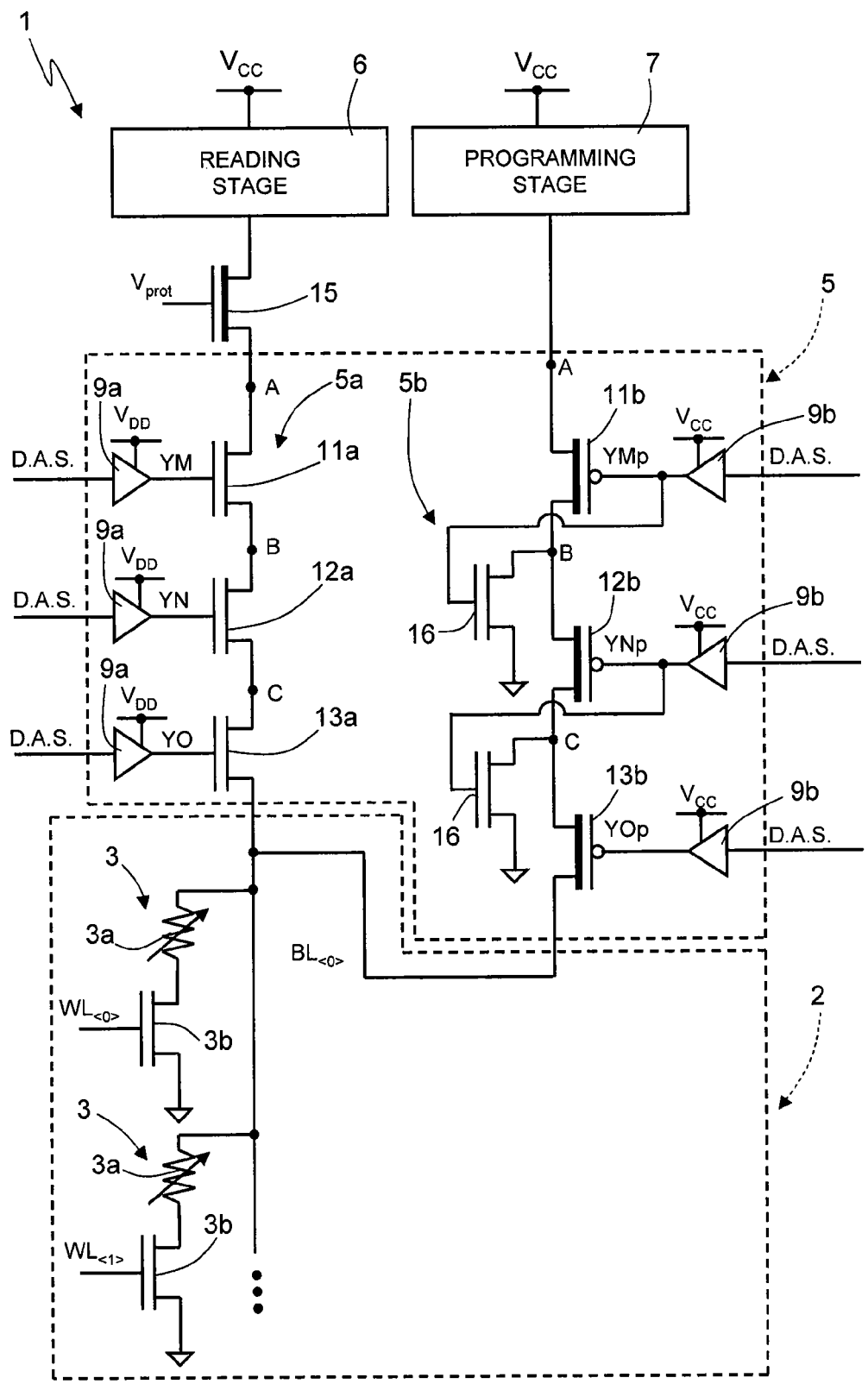
FIG. 2 shows a variant of the column decoder of FIG. 1.

A variant of the circuit solution described, shown in FIG. 2, envisages that the intermediate nodes B and C between each bitline BL and the programming stage 7 are set to ground when the corresponding selection switches 11b, 12b are not selected, so as to prevent them remaining floating.

In detail, the programming decoder 5b in this case comprises, for each of the intermediate nodes B, C, a further NMOS transistor 16 having: a first current-conduction terminal connected to the same intermediate node; a second current-conduction terminal connected to a reference potential (for example, ground); and a gate terminal, which receives a respective control signal corresponding to the column-decoding signal YMp, YNp received by the selection switch 11b, 12b, the source terminal of which is connected to the same intermediate node. In this manner, the intermediate node C is controlled simultaneously with the PMOS selection switch 12b (and is set to ground by the corresponding NMOS transistor 16 when the selection switch 12b is deselected), whilst the intermediate node B is controlled simultaneously with the selection switch 11b.

A second embodiment envisages further optimization of the electrical characteristics of the reading path in the column decoder, by means of a dual-cascode architecture. In particular, in a per-se known manner, when a transistor is operated as a switch, the gate voltage is such as to minimize the drop across it (voltage across the drain and the source); when used as "cascode" the gate voltage is regulated to fix the voltage of the source terminal substantially irrespective of the value of the voltage at the drain terminal.

Figure 3:
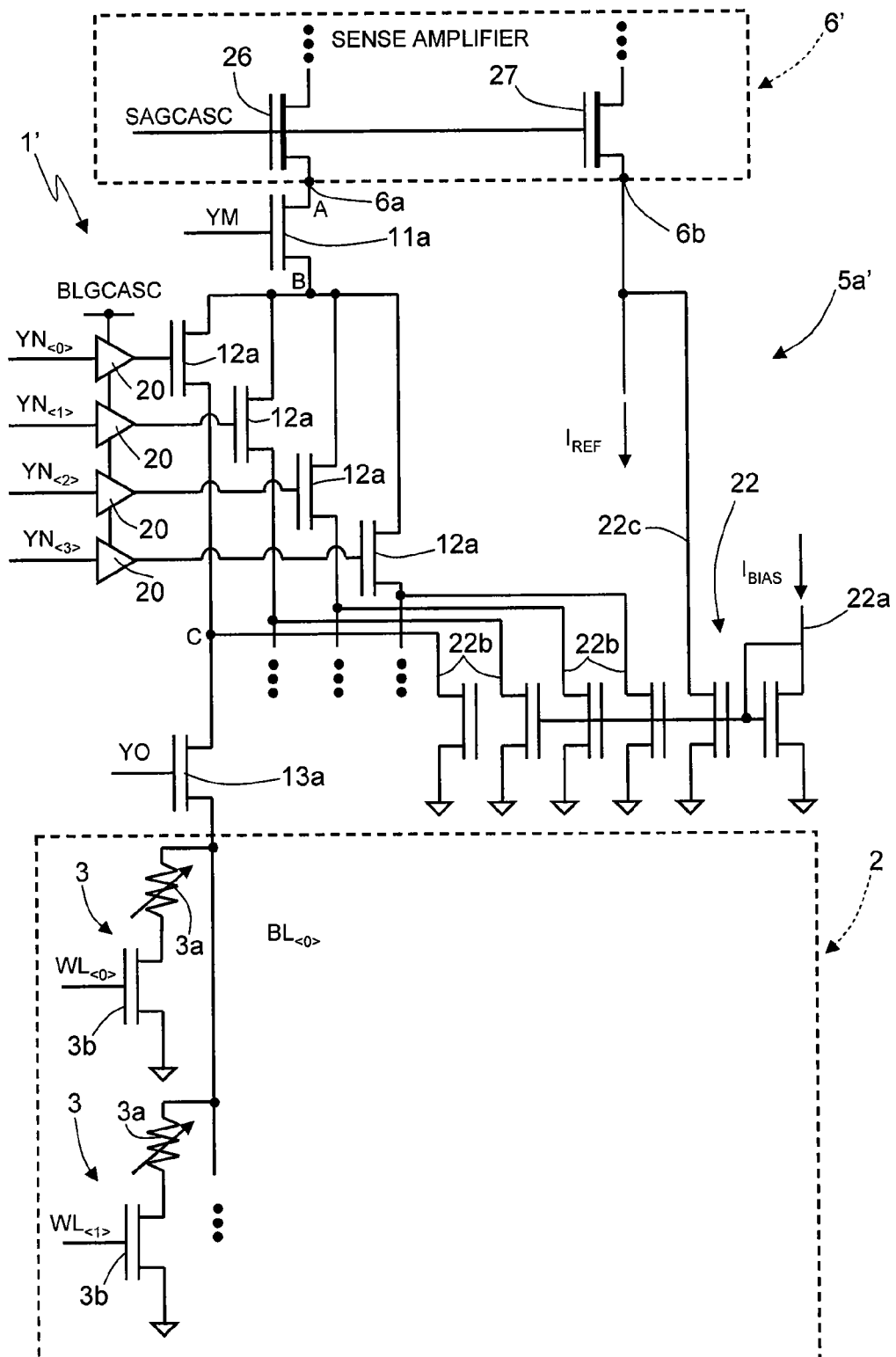
FIG. 3 shows a schematic circuit diagram of a portion of a non-volatile memory device, in particular of a PCM type, and of a corresponding column decoder, in accordance with a second embodiment.

FIG. 3 shows part of a non-volatile memory device, designated by 1', in accordance with the second embodiment, limitedly to the part of column decoding during reading (it being understood that the parts not illustrated do not differ substantially from what has been described with reference to FIG. 1 or FIG. 2); in FIG. 3, moreover, parts that are similar to others illustrated previously are designated by the same reference numbers.

In the reading decoder 5a' all the selection switches in a given hierarchical level are biased, when selected, as cascode devices in such a way as to define directly the voltage level of the selected bitline. In the example shown in FIG. 3, the selection switches 12a of the second hierarchical level (i.e., the ones receiving the column-decoding signals YN) are biased as cascode devices. In particular, shown purely by way of example are four selection switches 12a for each selection switch 11a of the first hierarchical level, which receive a respective column-decoding signal YN<0>, YN<1>, YN<2>, YN<3>; whilst, for simplicity of illustration, only one selection switch 13a of the third hierarchical level is illustrated, connected in series to a respective selection switch 12a (even though, in a known way, for example eight selection switches 13a could be provided for each selection switch 12a and organized according to a tree structure).

In detail, each selection switch 12a is driven by a driving stage 20, which receives at its input a respective column-decoding signal YN<0>, YN<1>, YN<2>, YN<3> and a supply signal BLGCASC, of a controlled value, and supplies at output to the control terminal of the selection switch 12a a driving signal having a stable and regulated value.

The reading decoder 5a' further comprises a current-mirror stage 22, obtained using NMOS transistors, which has an input branch 22a that receives a biasing current $I_{bias}$, and a plurality of mirrored branches 22b, each connected to the source terminal of a respective selection switch 12a (operating as cascode device).

The reading stage 6' comprises a first input 6a, on the side of the memory array 2, which receives the current circulating in the selected memory cell 3, and a second input 6b, on the side of the reference cell (here not illustrated), which receives (from the same reference cell) the reference current $I_{ref}$. The current-mirror stage 22 also comprises a further mirrored branch 22c, connected to the second input 6b of the reading stage 6'.

Each selection switch 12a, when driven by the respective driving stage 20, defines a first cascode stage within the reading-decoding path, and causes the voltage of the bitline, $V_{BL}$, to be given by the following relation:

$$V_{BL}=V_G-V_{GS}=V_G-(V_{TH}+V_{OV})$$

where $V_G$ is the biasing voltage of the gate terminal of the selection switch 12a, $V_{GS}$ is the voltage between the gate terminal and the source terminal of the selection switch 12a, $V_{TH}$ is the threshold voltage of the selection switch 12a, and $V_{OV}$ is the overdrive voltage of the same selection switch 12a, which depends on the current absorbed by the addressed memory cell 3, as well as on the size of the selection switch 12a.

Thanks to the fact that the intermediate node C is "cascoded" by the selection switch 12a each time the selection switch 12a is selected, its voltage depends exclusively on the voltage supplied on the gate terminal of the same selection switch 12a and not on the voltage of the intermediate node A or B (or of any other intermediate node) in the reading decoder 5a'. Hence, by appropriately biasing this gate terminal, it is possible to bias the drain terminal of the addressed memory cell 3 to the desired voltage (for example, the reading voltage $V_{read}$), which is independent both of the voltage drops on the selection switches of the reading decoder 5a' and of the voltage ripple possibly present on the nodes. Furthermore, the additional current injected by means of the current-mirror stage 22 increases the transconductance $g_m$ of the selection switch 12a, and thus renders biasing of the bitline faster, especially in the case of a memory cell that is reset (low current).

The mirrored branches 22b of the current-mirror stage 22 extract from the source terminal of the selection switches 12a in cascode configuration a current that is a replica of the biasing current $I_{bias}$, so as to guarantee that the bitline BL is correctly biased also when the current extracted from the memory cell 3 has a low value. In particular, this arrangement prevents the presence of any voltage overshoot on the selected memory cell 3. Given that the replica of the biasing current thus adds to the current extracted from the memory cell 3, a current of the same value is also extracted from the reference side of the reading stage 6', in such a way as to not alter the reading operations in the sense amplifiers. In particular, the current is extracted via the further mirrored branch 22c of the current-mirror stage 22.

Advantageously, the non-volatile memory device 1' comprises further cascode devices at the sense amplifiers level, both on the side of the memory array and on the side of the reference memory cell.

In detail, two further high-voltage NMOS transistors 26, 27, biased in cascode configuration, are connected between a respective input of the sense amplifier (not illustrated herein) and the first input 6a or, respectively, the second input 6b, and receive on their gate terminal a biasing signal SAGCASC, of a stable and precise value. The further NMOS transistors 26, 27 define a second cascode stage, in series with the aforesaid first cascode stage in the reading path, which enables a voltage to be established of a substantially constant value on the first intermediate node A, according to the biasing signal SAGCASC (in a way similar to what has been described previously).

In particular, it is possible to bias the first intermediate node A at the desired voltage without any appreciable delays during the reading operations, and in a way independent of the load on the bitline, thus improving the access time. The reading path is consequently divided into two portions, each biased by a respective cascode stage in a stable and precise manner, without any appreciable access delays and with a faster evolution towards a steady state: in particular, a first portion, up to the intermediate node C is biased by the first cascode stage, whilst a second portion, up to the intermediate node A, is biased by the second cascode stage.

Figure 4:
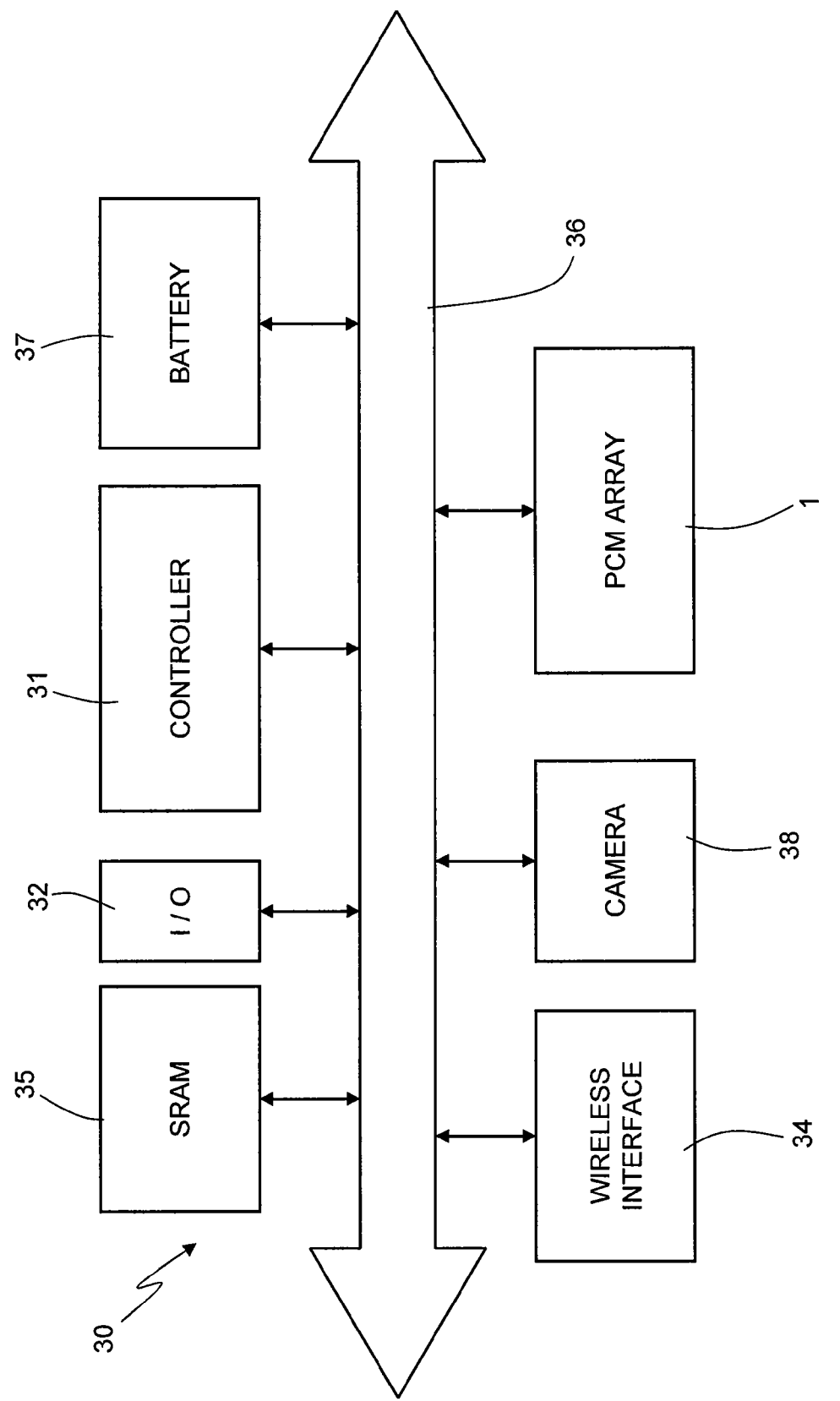
FIG. 4 is a schematic block diagram of an electronic system incorporating the non-volatile memory device in a further embodiment.

FIG. 4 shows a portion of an electronic system 30, according to a further embodiment. The electronic system 30 can be used in electronic devices, such as for example: a PDA (Personal Digital Assistant); a portable or fixed computer, possibly with wireless data-transfer capacity; a mobile phone; a digital audio player; a photographic camera or a camcorder; or further devices able to process, store, transmit and receive information.

In detail, the electronic system 30 comprises: a controller 31 (for example, provided with a microprocessor, a DSP, or a microcontroller); an input/output device 32 (for example, provided with a keypad and a display), for input and display of data; the non-volatile memory device 1, 1', provided with the array of memory cells of the phase-change type, previously described; a wireless interface 34, for example, an antenna, for transmitting and receiving data through a radiofrequency wireless communication network; and a RAM 35, all of which are connected through a bus 36. A battery 37 can be used as electrical-supply source in the electronic system 30, which can also be provided with a photographic camera or camcorder 38.

From what has been described and illustrated previously, the advantages that the column decoder according to the invention enables are clear.

In any case, it is again underlined that the separation of the current paths in the column decoding between reading and programming enables independent and optimized sizing and design of the corresponding electronic components, enabling improved performance to be obtained both in reading and in programming. In particular, the use of just NMOS transistors in reading enables a greater circuit simplicity and a saving in the area occupation to be obtained as compared to a high-voltage CMOS solution, whilst the use of just PMOS transistors in programming enables prevention of the problems due to the body effect and to the use of high voltages in the programming operations (which would, instead, be required in the case NMOS transistors were used).

Moreover, it is significant the advantage linked to the capacitive uncoupling between the reading and programming paths, given that the PMOS selection switches are very large on account of the high programming current.

The cascode architecture in read decoding enables reduction of the reading errors, biasing the bitline at stable voltages that are independent, for example, of process and temperature variations, also improving the access times to the memory.

Finally, it is clear that modifications and variations may be made to what has been described and illustrated herein, without thereby departing from the scope of the present disclosure.

In particular, the column decoder described and illustrated can be advantageously applied also in other types of memory devices, for example, in flash-memory devices.

It is clear that a different number of selection switches in the column decoder can be provided, and a different organization thereof in hierarchical levels. In addition, the first cascode stage in the second embodiment could be implemented by selection switches of a different, or further, hierarchical level.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A column decoder for a phase-change memory device provided with an array of memory cells, a reading stage for reading data contained in said memory cells, and a programming stage for programming said data; said column decoder comprising:
    a first reading terminal configured to be coupled to the reading stage;
    a programming terminal configured to be coupled to the programming stage;
    a bitline terminal configured to be coupled to a bitline of the array;
    a first decoder circuit configured to provide a first current path between said bitline terminal and said first reading terminal,
    a second decoder circuit, distinct and separate from said first decoder circuit, configured to provide a second current path, distinct from said first current path, between said bitline terminal and said programming terminal, wherein said first current path includes a first plurality of selection switches connected in series between said bitline terminal and said first reading terminal, and said second current path includes a second plurality of selection switches connected in series between said bitline terminal and said programming terminal; said selection switches of said first plurality and said selection switches of said second plurality being alternatively enabled according to address-selection signals; and
    a switch element configured to connect a reference potential to an intermediate node of said second current path, the intermediate node being between two consecutive selection switches of said second plurality; said switch element being operable when said second current path is not enabled.

2. The decoder according to claim 1, wherein said selection switches of said first plurality are low-voltage NMOS transistors, and said selection switches of said second plurality are high-voltage PMOS transistors.

3. The decoder according to claim 1, wherein said first plurality of selection switches includes a cascode selection switch in cascode configuration.

4. The decoder according to claim 3, further comprising a driving stage configured to receive a first reference voltage and to drive a control terminal of said cascode selection switch with a driving signal having a value defined by said first reference voltage; and wherein a voltage of said bitline terminal is defined by said first reference voltage.

5. A column decoder for a phase-change memory device provided with an array of memory cells, a reading stage for reading data contained in said memory cells, and a programming stage for programming said data said column decoder comprising:
    a first reading terminal configured to be coupled to the reading stage;
    a programming terminal configured to be coupled to the programming stage;
    a bitline terminal configured to be coupled to a bitline of the array;
    a first decoder circuit configured to provide a first current path between said bitline terminal and said first reading terminal,
    a second decoder circuit, distinct and separate from said first decoder circuit, configured to provide a second current path, distinct from said first current path, between said bitline terminal and said programming terminal, wherein said first current path includes a first plurality of selection switches connected in series between said bitline terminal and said first reading terminal, and said second current path includes a second plurality of selection switches connected in series between said bitline terminal and said programming terminal; said selection switches of said first plurality said selection switches of said second plurality being alternatively enabled according to address-selection signals, wherein said first plurality of selection switches includes a cascode selection switch in cascode configuration;
    a driving stage configured to receive a first reference voltage and to drive a control terminal of said cascode selection switch with a driving signal having a value defined by said first reference voltage; and wherein a voltage of said bitline terminal is defined by id first reference voltage; and
    a current-extraction stage configured to receive a biasing current and to extract from a current-conduction terminal of said cascode selection switch a current with a value correlated to said biasing current; said current-extraction stage comprising a current mirror, having a reference branch which receives said biasing current, and a mirrored branch connected to said current-conduction terminal of said cascode selection switch.

6. The decoder according to claim 5, wherein said first reading terminal is configured to receive an electrical quantity correlated to a current circulating in an addressed memory cell coupled to the bitline terminal, the decoder further comprising a second reading terminal configured to receive an electrical quantity correlated to a reference current; and wherein said current-extraction stage is configured to extract from said second reading terminal a current with a value correlated to said biasing current.

7. A phase-change memory device, comprising:
    an array of memory cells, the array including a bitline;
    a reading stage for reading data contained in said memory cells;
    a programming stage for programming said data; and
    a column decoder that includes:
        a first reading terminal coupled to the reading stage;
        a programming terminal coupled to the programming stage;
        a bitline terminal coupled to the bitline of the array;

a first decoder circuit configured to provide a first current path between said bitline terminal and said first reading terminal, and a second decoder circuit, distinct and separate from said first decoder circuit, configured to provide a second current path, distinct from said first current path, between said bitline terminal and said programming terminal, wherein:

said first current path includes a first plurality of selection switches connected in series between said bitline terminal and said first reading terminal, and said second current path includes a second plurality of selection switches connected in series between said bitline terminal and said programming terminal; said selection switches of said first plurality and said selection switches of said second plurality being alternatively enabled according to address-selection signals;

said first plurality of selection switches includes a cascode selection switch in cascode configuration, the decoder further comprising a driving stage configured to receive a first reference voltage and to drive a control terminal of said cascode selection switch with a driving signal having a value defined by said first reference voltage; and wherein a voltage of said bitline terminal is defined by said first reference voltage; and said first reading terminal is configured to receive an electrical quantity correlated to a current circulating in an addressed memory cell coupled to the bitline; wherein said first current path includes a first portion set between said bitline and said current-conduction terminal of said cascode selection switch, and a second portion set between a further current-conduction terminal of said cascode selection switch and said first reading terminal, wherein said reading stage includes a transistor in cascode configuration, having a current-conduction terminal coupled to said first reading terminal and a control terminal configured to receive a second reference voltage, of a stable and precise value.

8. The device according to claim 7, wherein each one of said memory cells comprises: a phase-change region coupled to said bitline; and a selector transistor coupled to said phase-change region and having a control terminal connected to a wordline of said array.

9. A phase-change memory device, comprising:
an array of memory cells, the array including a bitline;
a reading stage for reading data contained in said memory cells;
a programming stage for programming said data; and
a column decoder that includes:
a first reading terminal coupled to the reading stage;
a programming terminal coupled to the programming stage;
a bitline terminal coupled to the bitline of the array;
a first decoder circuit configured to provide a first current path between said bitline terminal and said first reading terminal, and
a second decoder circuit, distinct and separate from said first decoder circuit, configured to provide a second current path, distinct from said first current path, between said bitline terminal and said programming terminal, wherein:
said first current path includes a first plurality of selection switches connected in series between said bitline terminal and said first reading terminal, and said second current path includes a second plurality of selection switches connected in series between said bitline terminal and said programming terminal; said selection switches of said first plurality and said selection switches of said second plurality being alternatively enabled according to address-selection signals; and
said first plurality of selection switches includes a cascode selection switch in cascode configuration, the decoder further comprising a driving stage configured to receive a first reference voltage and to drive a control terminal of said cascode selection switch with a driving signal having a value defined by said first reference voltage; and wherein a voltage of said bitline terminal is defined by said first reference voltage; and
a current-extraction stage configured to receive a biasing current and to extract from a current-conduction terminal of said cascode selection switch a current with a value correlated to said biasing current; said current-extraction stage comprising a current mirror, having a reference branch which receives said biasing current, and a mirrored branch connected to said current-conduction terminal of said cascode selection switch.

10. An electronic system, comprising:
a processor; and
a phase-change memory device coupled to the processor and including:
an array of memory cells, the array including a bitline;
a reading stage for reading data contained in said memory cells;
a programming stage for programming said data; and
a column decoder that includes:
a first reading terminal coupled to the reading stage;
a programming terminal coupled to the programming stage;
a bitline terminal coupled to the bitline of the array;
a first decoder circuit configured to provide a first current path between said bitline terminal and said first reading terminal, and
a second decoder circuit, distinct and separate from said first decoder circuit, configured to provide a second current path, distinct from said first current path, between said bitline terminal and said programming terminal, wherein:
said first current path includes a first plurality of selection switches connected in series between said bitline terminal and said first reading terminal, and said second current path includes a second plurality of selection switches connected in series between said bitline terminal and said programming terminal; said selection switches of said first plurality and said selection switches of said second plurality being alternatively enabled according to address-selection signals;
said first plurality of selection switches includes a cascode selection switch in cascode configuration, the decoder further comprising a driving stage configured to receive a first reference voltage and to drive a control terminal of said cascode selection switch with a driving signal having a value defined by said first reference voltage; and wherein a voltage of said bitline terminal is defined by said first reference voltage; and
said first reading terminal is configured to receive an electrical quantity correlated to a current circulating in an addressed memory cell coupled to the bitline; wherein said first current path includes a first portion set between said bitline and said current-conduction terminal of said cascode selection switch, and a second portion set between a further current-conduction terminal of said cascode selection switch and said first reading terminal, wherein said reading stage includes a transistor in cascode configuration, having a current-conduction terminal coupled to said first reading terminal and a control terminal configured to receive a second reference voltage, of a stable and precise value.

11. An electronic system, comprising:
a processor; and
a phase-change memory device coupled to the processor and including:
  an array of memory cells, the array including a bitline;
  a reading stage for reading data contained in said memory cells;
  a programming stage for programming said data and
  a column decoder that includes:
    a first reading terminal coupled to the reading stage;
    a programming terminal coupled to the programming stage;
    a bitline terminal coupled to the bitline of the array;
    a first decoder circuit configured to provide a first current path between said bitline terminal and said first reading terminal, and
    a second decoder circuit, distinct and separate from said first decoder circuit, configured to provide a second current path, distinct from said first current path, between said bitline terminal and said programming terminal, wherein:
    said first current path includes a first plurality of selection switches connected in series between said bitline terminal and said first reading terminal, and said second current path includes a second plurality of selection switches connected in series between said bitline terminal and said programming terminal; said selection switches of said first plurality and said selection switches of said second plurality being alternatively enabled according to address-selection signals; and
    said first plurality of selection switches includes a cascode selection switch in cascode configuration, the decoder further comprising a driving stage configured to receive a first reference voltage and to drive a control terminal of said cascode selection switch with a driving signal having a value defined by said first reference voltage; and wherein a voltage of said bitline terminal is defined by said first reference voltage; and
  a current-extraction stage configured to receive a biasing current and to extract from a current-conduction terminal of said cascode selection switch a current with a value correlated to said biasing current; said current-extraction stage comprising a current mirror, having a reference branch which receives said biasing current, and a mirrored branch connected to said current-conduction terminal of said cascode selection switch.

12. The system according to claim 10, further comprising a camera coupled to the processor.

\* \* \* \* \*

UNITED STATES PATENT AND TRADEMARK OFFICE
CERTIFICATE OF CORRECTION

PATENT NO. : 8,264,872 B2
APPLICATION NO. : 12/548241
DATED : September 11, 2012
INVENTOR(S) : Guido De Sandre et al.

It is certified that error appears in the above-identified patent and that said Letters Patent is hereby corrected as shown below:

In the Claims

Column 10, Line 7, Claim 5
"stage for programming said data said column decoder" should read, --stage for programming said data; said column decoder--.

Column 10, Line 37, Claim 5
"said bitline terminal is defined by id first reference" should read, --said bitline terminal is defined by said first reference--.

Column 13, Line 21, Claim 11
"a programming stage for programming said data and" should read, --a programming stage for programming said data; and--.

Signed and Sealed this
Twenty-fourth Day of September, 2013

Teresa Stanek Rea
*Deputy Director of the United States Patent and Trademark Office*